United States Patent
Briggs et al.

(10) Patent No.: US 10,395,977 B2
(45) Date of Patent: Aug. 27, 2019

(54) SELF ALIGNED VIA AND PILLAR CUT FOR AT LEAST A SELF ALIGNED DOUBLE PITCH

(71) Applicant: INTERNATIONAL BUSINESS MACHINES CORPORATION, Armonk, NY (US)

(72) Inventors: Benjamin D. Briggs, Waterford, NY (US); Lawrence A. Clevenger, LaGrangeville, NY (US); Michael Rizzolo, Albany, NY (US); Terry A. Spooner, Clifton Park, NY (US); Theodorus E. Standaert, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 97 days.

(21) Appl. No.: 15/396,961

(22) Filed: Jan. 3, 2017

(65) Prior Publication Data
US 2017/0117177 A1    Apr. 27, 2017

Related U.S. Application Data

(62) Division of application No. 14/755,647, filed on Jun. 30, 2015, now Pat. No. 9,548,243.

(51) Int. Cl.
*H01L 21/768* (2006.01)
*H01L 21/31* (2006.01)
(Continued)

(52) U.S. Cl.
CPC .... *H01L 21/76816* (2013.01); *H01L 21/0332* (2013.01); *H01L 21/0335* (2013.01);
(Continued)

(58) Field of Classification Search
CPC .................................................. H01L 21/0335
See application file for complete search history.

(56) References Cited

U.S. PATENT DOCUMENTS 8,728,945 B2   5/2014   Lytle
8,839,168 B2   9/2014   Kye et al.
(Continued)

OTHER PUBLICATIONS

List of IBM Patents or Patent Applications Treated as Related dated Jan. 3, 2017, 2 pages.

*Primary Examiner* — Moazzam Hossain
*Assistant Examiner* — Omar F Mojaddedi
(74) *Attorney, Agent, or Firm* — Tutunjian & Bitetto, P.C.; Alvin Borromeo

(57) ABSTRACT

A method of forming via openings that includes forming sidewall spacers on a plurality of mandrels that are overlying a hardmask layer that is present on an interlevel dielectric layer. Etching the hardmask layer using a portion of the sidewall spacers and the plurality of mandrels to form a first pillar of hardmask material. The interlevel dielectric layer is etched using the first pillar of hardmask material as a mask to define a first via opening. The plurality of mandrels are removed. The hardmask layer is etched using the spacers to define a second pillar of hardmask material. The interlevel dielectric layer is etched using the second pillar of hardmask material to provide a second via opening.

8 Claims, 10 Drawing Sheets

(51) Int. Cl.
  *H01L 21/311*    (2006.01)
  *H01L 21/3105*   (2006.01)
  *H01L 21/033*    (2006.01)
  *H01L 23/522*    (2006.01)
  *H01L 23/532*    (2006.01)

(52) U.S. Cl.
  CPC ...... *H01L 21/0337* (2013.01); *H01L 21/0338* (2013.01); *H01L 21/31053* (2013.01); *H01L 21/31144* (2013.01); *H01L 21/76802* (2013.01); *H01L 21/76831* (2013.01); *H01L 21/76877* (2013.01); *H01L 21/76897* (2013.01); *H01L 23/5226* (2013.01); *H01L 23/5329* (2013.01)

(56) References Cited

U.S. PATENT DOCUMENTS

| | | | |
|---|---|---|---|
| 8,883,649 B2 | 11/2014 | Yin et al. | |
| 2007/0205443 A1* | 9/2007 | Juengling | H01L 21/76229 257/288 |
| 2014/0315380 A1 | 10/2014 | Kanakasabapathy et al. | |
| 2016/0190004 A1* | 6/2016 | Song | H01L 21/31144 438/618 |

\* cited by examiner

SELF ALIGNED VIA AND PILLAR CUT FOR AT LEAST A SELF ALIGNED DOUBLE PITCH

BACKGROUND

Technical Field

The present disclosure relates to structures for transmitting electrical current.

Description of the Related Art

As the technology node advances in semiconductor devices, the dimensions of the semiconductor devices continue to decrease. As millions of devices and circuits are positioned onto a semiconductor chip, the wiring density and the number of metal levels are increased generation after generation. As interconnect dimensions continue to decrease and the density of interconnect structures and devices increase, the alignment between different interconnect structures becomes more crucial.

SUMMARY

In one embodiment, the present disclosure provides a method for forming via openings. The method may be used for forming electrically conductive structures, such as metal vias through interlevel dielectric material layers. In one embodiment, the method of forming the via openings may include forming sidewall spacers on a plurality of mandrels that are overlying a hardmask layer. The hardmask layer is present on an interlevel dielectric layer. The hardmask layer is etched using a portion of the sidewall spacers and the plurality of mandrels to define a first pillar of hardmask material. The interlevel dielectric layer is etched using the first pillar of hardmask material and a first via etch mask to provide a first via opening. The plurality of mandrels may then be removed. The hardmask layer may be etched using the sidewall spacers to define a second pillar of hardmask material. The interlevel dielectric layer may be etched with the second pillar of hardmask material and a second via etch mask to provide a second via opening.

In another aspect, the present disclosure provides a method of forming an electrically conductive structure. In one embodiment, the method of forming the electrically conductive structure may include etching a hardmask layer that is present atop an interlevel dielectric layer using a plurality of mandrels having dielectric spacers on sidewalls of the plurality of mandrels to define a first pillar of hardmask material. The interlevel dielectric layer is etched using the first pillar of hardmask material and a first via etch mask to provide a first via opening. The plurality of mandrels may then be removed. The hardmask layer is etched with the dielectric spacers to define a second pillar of hardmask material. The interlevel dielectric layer is etched with the second pillar of hardmask material and a second via etch mask to provide a second via opening. The first and second via openings are filled with an electrically conductive material.

In another embodiment, a method of forming via openings is provided that includes forming a first set of spacers on sidewalls of a first set of mandrels. The first set of mandrels is present on a material layer for forming a second mandrel that is present overlying at least one interlevel dielectric layer. The mandrel material layer is etched using the first set of spacers as an etch mask to form a second set of mandrels. Etching the mandrel material layer can include removing the first set of mandrels. A second set of spacers is formed on the second set of mandrels. The hardmask layer is etched using the second set of spacers on the second set of mandrels to define a first pillar of hardmask material. The interlevel dielectric layer is etched using the first pillar of hardmask material and a first via etch mask to provide a first via opening. The second set of mandrels may be removed. A second via opening may then be formed in the interlevel dielectric layer.

BRIEF DESCRIPTION OF DRAWINGS

The disclosure will provide details in the following description of preferred embodiments with reference to the following figures wherein:

FIG. 3B is a top down view of the structure depicted in FIG. 3A, in which FIG. 3A is a cross-section along section line A-A.

FIG. 4B is a top down view of the structure depicted in FIG. 4A, in which FIG. 4A is a cross-section along section line A-A.

FIG. 6B is a top down view of the structure depicted in FIG. 6A, in which FIG. 6A is a cross-section along section line A-A.

FIG. 7B is a top down view of the structure depicted in FIG. 6A, in which FIG. 7A is a cross-section along section line A-A.

DETAILED DESCRIPTION OF PREFERRED EMBODIMENTS

Figure 1A:
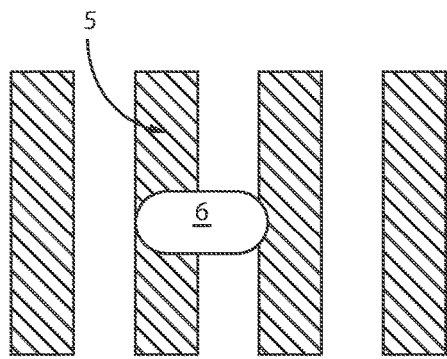
FIG. 1A is a top down view illustrating the process window for via and/or pillar cut in a conventional process sequence.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "present on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

Self-aligned double pitch (SADP) and self-aligned quadruple pitch (SAQP) methods allow for tight line/space array. However, for back end of the line (BEOL) logic, pillar and via shapes should be inserted to create line-ends and via connections to prior-level metal wirings. Depending on the metal pitch, the placement of these shapes can be challenging due to overlay, as well as line-end pull-back of the pillar and via-bar shapes. The present disclosure allows for a significant relief for the placement of the pillar and via shapes. For example, the present disclosure uses mandrels to relax the placement criteria by approximately 3 times (3×) or greater. As will be further described below, the self-aligned double pitch (SADP) and self-aligned quadruple (SAQP) methods of the present disclosure may have a mandrel in place once the final sidewall spacers are created. In accordance with the present disclosure, one can take advantage of this to keep the via and pillar placement at basically 3× the conventional process window.

Figure 1B:
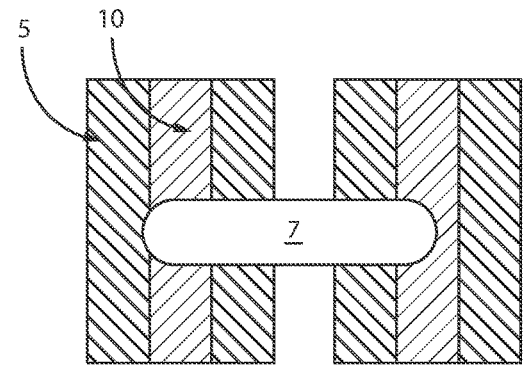
FIG. 1B is a top down view illustrating the process window for via and/or pillar cut in a process sequence in accordance with the present disclosure.

FIGS. 1A and 1B illustrate a comparison of the process window provided by the methods of the present disclose in comparison to a conventional method. The methods disclosed herein, use a mandrel to relax placement criteria by 3× or greater. FIG. 1A illustrates a conventional structure including sidewall spacers 5, in which a via and/or pillar cut illustrative of a conventional process window is illustrated by reference number 6. FIG. 1B illustrates an electrical communication structure including sidewall spacers 5 and mandrels 10, in which a via and/or pillar cut illustrative of a process window provided by the methods and structures of the present disclosure is illustrated by reference number 7. The process window depicted in FIG. 1B is approximately 3× the process window depicted in FIG. 1A illustrating the significant relief provided by the methods and structures of the present disclosure. The methods and structures disclosed herein also increases the process windows resistance to pattern collapse as the sidewall spacers can always be anchored. Some embodiments of the methods and structures disclosed herein, are now described in more detail with reference to FIGS. 2-9.

Figure 2:
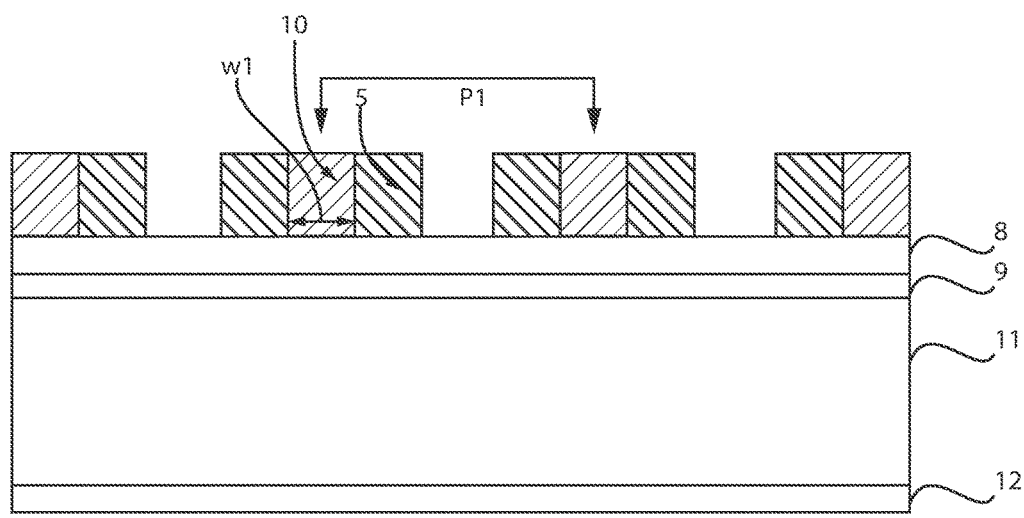
FIG. 2 is a side cross-sectional view depicting forming a mandrel pattern and sidewall spacers atop a hardmask dielectric layer that is present on at least one layer of interlevel dielectrics for a self-aligned double pitch (SADP) method in accordance with one embodiment of a present disclosure.

FIG. 2 depicts one embodiment of forming patterned mandrels 10 and sidewall spacers 5 atop at least one hardmask dielectric layer 8, 9 that is present on at least one layer of interlevel dielectric 11 for a self-aligned double pitch (SADP) method. The interlevel dielectric layer is present over a cap material layer 12. The cap material layer 12 may be present over at least one device layer (not shown). In one embodiment, the at least one device layer may include dielectric layers, semiconductor layers and metal layers that can be arranged to provide microelectronic devices, or smaller devices, which can include semiconductor devices, such as field effect transistors (FETs), fin type field effect transistors (FinFETs), bipolar junction transistors (BJT) and combinations thereof. The at least one device layer may also include memory devices, such as dynamic random access memory (DRAM), embedded dynamic random access memory (EDRAM), flash memory and combinations thereof. The at least one device layer can also include passive devices, such as resistors and capacitors, as well as electrical connections to the devices containing within the at least one device layer.

The cap material layer 12 may be composed of a barrier low-k (BLOK) dielectric. BLOK is a low-k CVD barrier film, which is sometimes designated as BloK. The amorphous film is composed of silicon, carbon and hydrogen. BLOK may have a dielectric constant of less than 5. The cap material layer 12 may be deposited using chemical vapor deposition (CVD), chemical solution deposition, spin on deposition, or other like deposition methods.

The at least one interlevel dielectric layer 11 may be composed of any dielectric layer and may be formed directly on the cap material layer 12. The at least one interlevel dielectric layer 11 may be composed of any number of layers, and can be composed of any number of dielectric compositions, including but not limited to oxides, nitrides and oxynitrides. For example, the at least one interlevel dielectric layer 11 may be composed of $SiO_2$, $Si_3N_4$, SiCOH, SiLK, and combinations thereof. In some examples, the at least one interlevel dielectric layer 11 may be composed of a low-k dielectric. The term "low-k" denotes a material having a dielectric constant that is less than silicon dioxide at room temperature (e.g., 25° C.). In one embodiment, a second interlevel dielectric layer of a low-k dielectric has a dielectric constant that is less than 4.0, e.g., 3.9. In another embodiment, the at least one interlevel dielectric layer 11 of a low-k dielectric may have a dielectric constant ranging from 1.75 to 3.5. In yet another embodiment, an interlevel dielectric layer of a low-k dielectric may have a dielectric constant ranging from 2.0 to 3.2. Examples of materials suitable for a low-k dielectric that can provide the at least one interlevel dielectric layer 11 include organosilicate glass (OSG), fluorine doped silicon dioxide, carbon doped silicon dioxide, porous silicon dioxide, porous carbon doped silicon dioxide, spin-on organic polymeric dielectrics (e.g., SILK™), spin-on silicone based polymeric dielectric (e.g., hydrogen silsesquioxane (HSQ), undoped silica glass, diamond like carbon (DLC), methylsilsesquioxane (MSQ) and combinations thereof. The at least one interlevel dielectric layer 11 may be deposited using chemical vapor deposition (CVD), such as plasma enhanced chemical vapor deposition (PECVD), chemical solution deposition, spin on deposition and combinations thereof.

Still referring to FIG. 2, the at least one hard mask dielectric layer 8, 9 may include any number of hardmask dielectric materials. The first hard mask dielectric layer 9 that is present on the at least one interlevel dielectric layer 11 may be a nitride, such as silicon nitride. In another example, the first hard mask dielectric layer 9 may be silicon oxynitride or silicon carbon nitride (SiCN). The first hard mask dielectric layer 9 may also be composed of an oxide. The first hard mask dielectric layer 9 may be formed using chemical vapor deposition (CVD), such as plasma enhanced chemical vapor deposition (PECVD). The second hard mask dielectric layer 8 that is present on the first hard mask dielectric layer 9 may be a metal nitrides, such as titanium nitride (TiN). Other examples of metal nitrides that are suitable for the second hard mask dielectric layer 8 include tantalum nitride (TaN), tungsten nitride (WN), aluminum nitride (AlN) and combinations thereof. The second hard mask dielectric layer 8 may also be composed of an oxide. The second hard mask dielectric layer 8 may be deposited using chemical vapor deposition, such as plasma enhanced chemical vapor deposition (PECVD), or may be deposited using physical vapor deposition (PVD), such as sputtering. The above compositions provided for the first and second hard mask layers 9, 8 are provided for illustrative purposes only, and are not intended to limit the present disclosure, as other materials are equally suitable for these structures, so long as the materials selected provide for etch selectivity between the adjacent layers consistent with the process flow that is disclosed herein.

FIG. 2 depicts forming patterned mandrels 10 and sidewall spacers 5 atop at least one hardmask dielectric layer 8, 9. In some embodiments, the mandrels 10 may be composed of a nitride, but the composition of the mandrels 10 is not limited to only nitrides, as the mandrel material can include any material (semiconductor, dielectric or conductive) that can be selectively removed from the structure during a subsequently performed etching process. In one embodiment, the mandrels 10 may be composed of silicon nitride. Forming the mandrels 10 may begin with depositing a mandrel material layer on the upper surface of the second hardmask dielectric layer 8. Following deposition of the mandrel material layer, the mandrel material layer can be patterned by lithography and etching to form a plurality of mandrel structures 10. Each of the mandrel structures 10 may have a width W1 ranging from 7 nm to 30 nm. Adjacent mandrel structure 10 may be separated by a pitch P1 ranging from 28 nm to 120 nm. The pitch P1 may also be defined as 2× the pitch of the desired trenches.

The sidewall spacers 5 may then be formed on each of the sidewalls of the mandrels 10. The sidewall spacers 5 are typically composed of an oxide material. For example, the sidewall spacers 5 may be formed of silicon oxide. In other examples, the sidewall spacers 5 are composed of silicon oxynitride, hafnium oxide, or aluminum oxide. The sidewall spacers 5 can be formed by deposition of a dielectric spacer material and then etching the deposited dielectric spacer material. The deposition process for forming the dielectric spacer material may be a conformal deposition process. The term "conformal" denotes a deposition process that produces a layer having a thickness that does not deviate from greater than 30% of an average value for the thickness of the layer. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching (RIE). Typically, the etch process employed is directional, i.e., anisotropic, for removing the horizontal portions of the spacer dielectric material from the conformal layer, in which the vertical portions of the spacer dielectric material remain to provide the sidewall spacers 5. Each of the sidewall spacers 5 may have a width ranging from 7 nm to 30 nm.

Figure 3A:
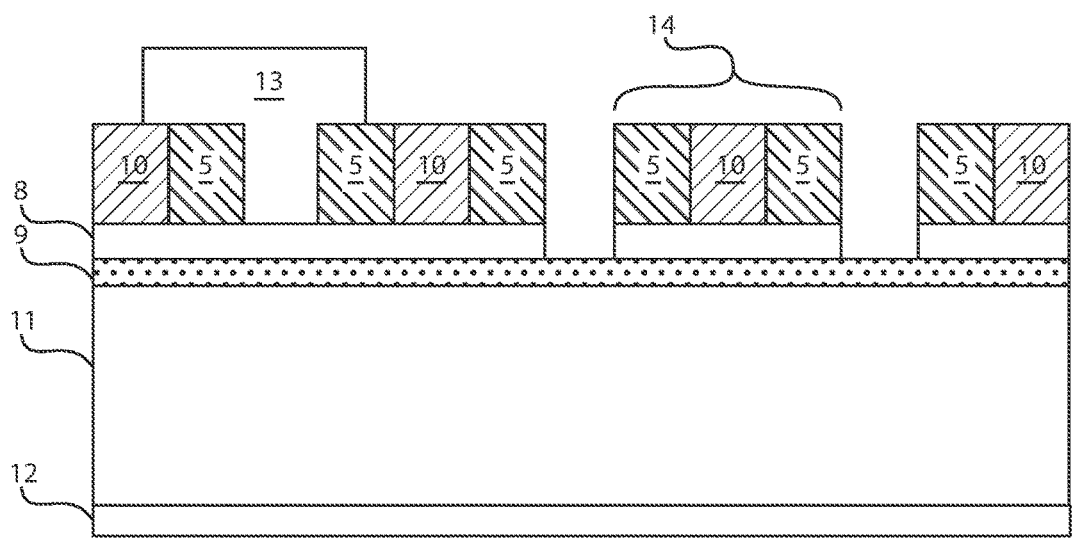
FIG. 3A is a side cross-sectional view depicting patterning a first pillar in the structure depicted in FIG. 2.
Figure 3B:
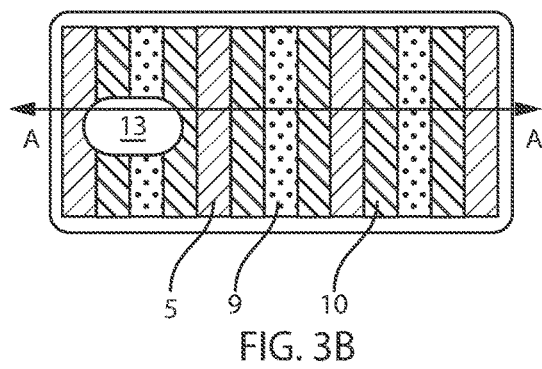

FIGS. 3A and 3B depicting patterning a first pillar 14. More specifically, FIG. 3 depicts one embodiment of etching the hardmask layer 8, i.e., second hardmask dielectric layer 8, using a portion of the sidewall spacers 5 and the plurality of mandrels 10 to form a first pillar 14 of hardmask material. In some embodiments, etching the hardmask layer 8 using a portion of the sidewall spacers 5 and the plurality of mandrels 10 to form the first pillar 14 of hardmask material further includes forming a first etch mask 13 exposing a portion of the second hardmask layer 8 to be etched and protecting a remaining portion of the second hardmask layer 8. The first etch mask 13 may be composed of photoresist. Forming the first etch mask 12 may include applying a layer of photoresist to the surface to be etched; exposing the photoresist to a pattern of radiation; and then developing the pattern into the photoresist utilizing a resist developer. Once the patterning of the photoresist is completed, the sections covered by the photoresist are protected while the exposed regions are treated with a selective etching process that removes some of the exposed materials depending upon the etch selectivity of the etch process. Referring to FIG. 3A, two portions of the second hardmask dielectric layer 8 are exposed, i.e., one on each side of a single mandrel 10 and spacer combination 5, where the rest of the hardmask dielectric layer 8 is protected by at least one of the mandrels 10, the first spacer 5 and the first etch mask 13.

Following formation of the first etch mask 13, the exposed portions of the second hardmask layer 8 are etched to provide at least two openings on opposing sides of the sidewall spacers 5 and the plurality of mandrels 10 that are exposed by the first etch mask 13 to form the first pillar 14 of hardmask material. The etch process for forming the first pillar 14 may be a selective etch process. As used herein, the term "selective" in reference to a material removal process denotes that the rate of material removal for a first material is greater than the rate of removal for at least another material of the structure to which the material removal process is being applied. For example, in some embodiments, the material of the second hardmask layer 8 may be removed by an etch that is selective to the first hardmask layer 8, the first etch mask 13, the sidewall spacers 5 and the plurality of mandrels 10. The etch process for forming the first pillar 15 may be anisotropic, i.e., directional. Examples of direction etch processes suitable for use with this stage of the present disclosure include reactive ion etch (RIE), plasma etch, and laser ablation. After performing the first pillar etch, the first etch mask 13 may be removed using chemical stripping, selective etching or oxygen ashing.

Figure 4A:
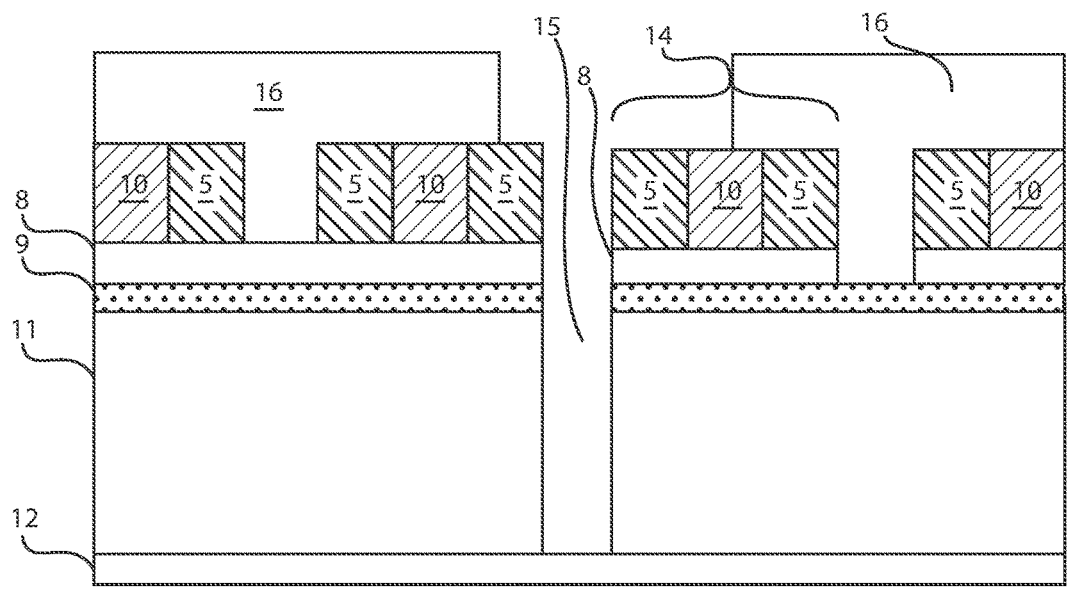
FIG. 4A is a side cross-sectional view depicting one embodiment of forming a first via opening, in accordance with the present disclosure.
Figure 4B:
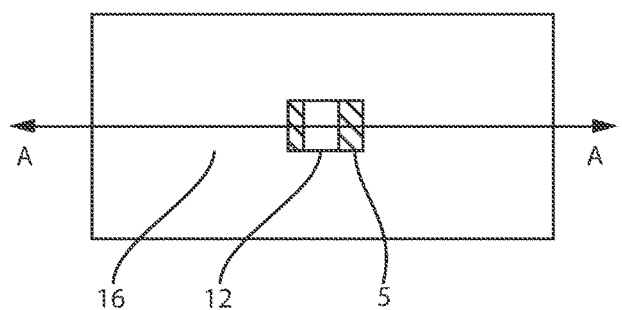

FIGS. 4A and 4B depict one embodiment of forming a first via opening 15 through the at least one interlevel dielectric layer 11. Forming the first via opening 15 may include etching the at least one interlevel dielectric layer 11 using the first pillar 14 of hardmask material. In some embodiments, forming the first via opening 15 may further include forming a second etch mask 16 over a portion of the sidewall spacers 5 and the plurality of mandrels 10. The second etch mask 16 may be a photoresist mask that can be similar to the first etch mask 13. Therefore, the above description of the first etch mask 13 including its composition and method of forming is applicable for the description of the second etch mask 13.

The second etch mask 16 includes an opening exposing one of the at least two openings through the first hardmask dielectric layer 8 that are on opposing sides of the sidewall spacers 5 corresponding to the first pillar 14 in which the first via 15 is to be formed. The second of the two openings, that is present on the opposing side of the first pillar 14 is covered, i.e., protected by the second etch mask 16. As depicted in FIG. 4A, the opening in the second etch mask 16 is greater in diameter than the diameter of the first via opening 15. A portion of the sidewall spacers 15 and mandrel 10 overlying the first pillar 14 is also exposed by the opening through the second etch mask 16. The second etch mask 16 only exposed one of the openings through the first hardmask dielectric layer 8.

Still referring to FIG. 4A, the at least one interlevel dielectric layer 11 is etched to provide the first via opening 15 using the first pillar 14 of hardmask material and the second etch mask 16. More specifically, the at least one interlevel dielectric layer 11 may be etched by a selective etch process that removes the material of the second hardmask dielectric layer 8 and the interlevel dielectric layer 11 selectively to second etch mask 16, as well as the portion of mandrels 10 and spacers 5 that are exposed by the opening through the second etch mask 16. Following formation of the first via opening 15, the second etch mask 16 may be removed via etching, chemical washing, and/or oxygen ashing.

Figure 5:
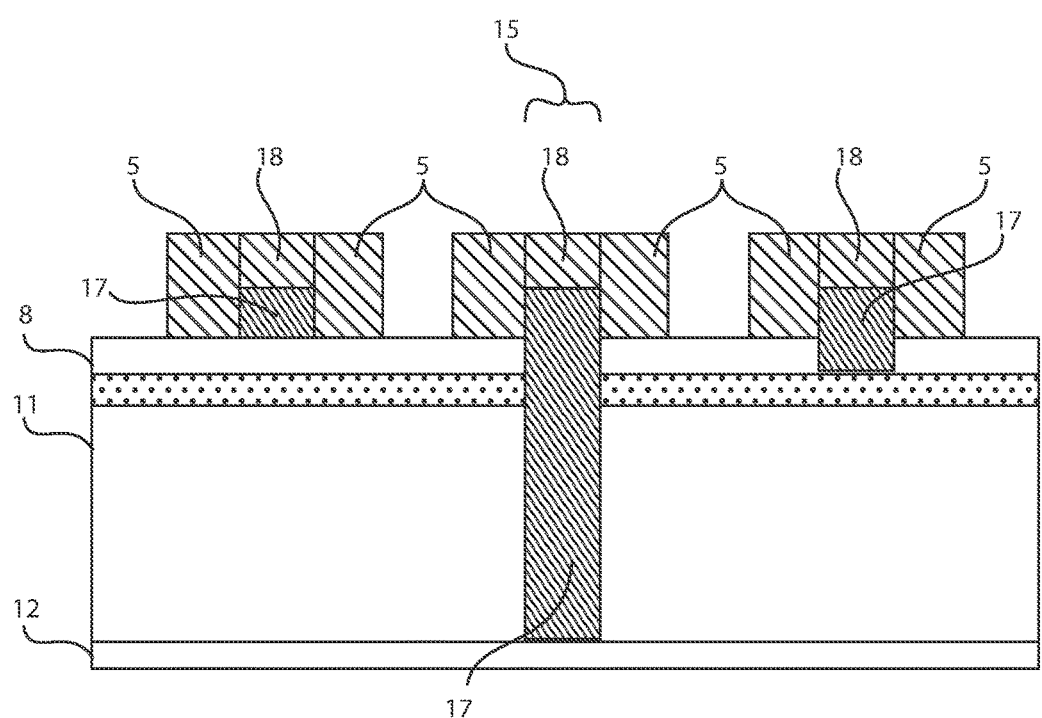
FIG. 5 is a side cross-sectional view depicting one embodiment of filling the via and a mandrel space with a first fill dielectric, recessing the first fill dielectric, forming a divot filling cap atop the recessed first fill dielectric, and removing the mandrel, in accordance with one embodiment of the present disclosure.

FIG. 5 depicts one embodiment of a structure in accordance with the present process flow following a sequence that includes filling the first via opening 15 and a mandrel space with a first fill dielectric 17, recessing the first fill dielectric 17, forming a divot filling cap 18 atop the recessed first fill dielectric 17, and removing the mandrels 10. The first fill dielectric 17 may be provided by an organic dielectric or organo-siloxane polymer ($R_xCH_{3y}SiO_z$ polymer (R=organic chomophore). Some examples of organo-siloxane polymers suitable for the first fill dielectric 17 include DUO™ 193 or 243 available from Honeywell Electronic Materials Inc. It is noted that this is only one example of a first fill dielectric 17 that is suitable for use with the present disclosure. Other examples of dielectric compositions suitable for the first fill dielectric 17 include oxides, nitrides and oxynitrides. The first fill dielectric 17 may deposited using spin on deposition for polymeric type compositions. Chemical vapor deposition (CVD) and physical vapor deposition (PVD) methods may also be used for depositing the first fill dielectric 17. Following deposition, the first fill dielectric 17 may be planarized, e.g., planarized by chemical mechanical planarization (CMP), so that the upper surface of the first fill dielectric 17 is coplanar with the upper surface of the sidewall spacers 5 and the mandrels 10.

In a following process step, the upper surface of the first fill dielectric 17 may be recessed by an etch step, such as reactive ion etch (RIE). The etch step for recessing the first fill dielectric 17 may be selective to the sidewall spacers 5 and the mandrels 10. The divot filling cap 18 may be formed atop the recessed surfaces of the first fill dielectric 17. The divot filling cap 18 may have a composition that is similar to the composition of the sidewall spacers 5. For example, the divot filling cap 18 may be an oxide, such as silicon oxide ($SiO_2$), that is deposited using chemical vapor deposition (CVD) or like process. Following material layer deposition for the divot filling cap 18, a planarization process, such as chemical mechanical planarization (CMP), may be performed so that an upper surface of the divot filling cap 18 is coplanar with an upper surface of the first spacer 5 and the mandrels 10.

The mandrels 10 may then be removed by an etch process that is selective to the sidewall spacer 5, the divot filling cap 18 and a remaining portion of the second hardmask dielectric layer 8. The etch process for removing the mandrels may be reactive ion etch (RIE) or a wet chemical etch.

Figure 6A:
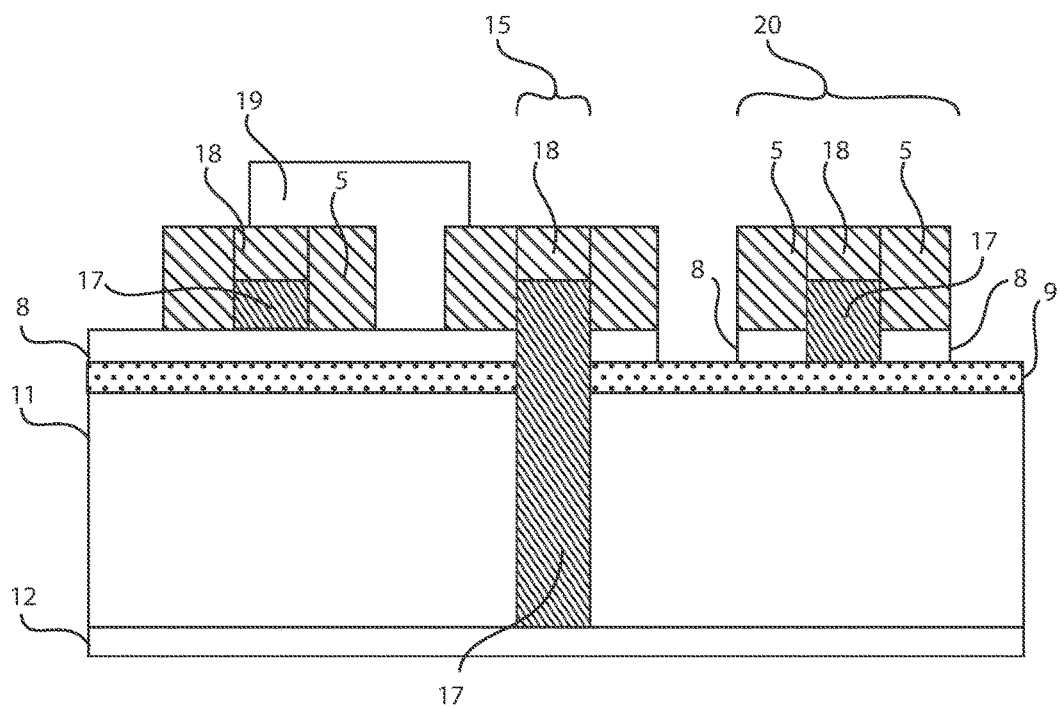
FIG. 6A is a side cross-sectional view depicting forming a second pillar in the structure depicted in FIG. 5.
Figure 6B:
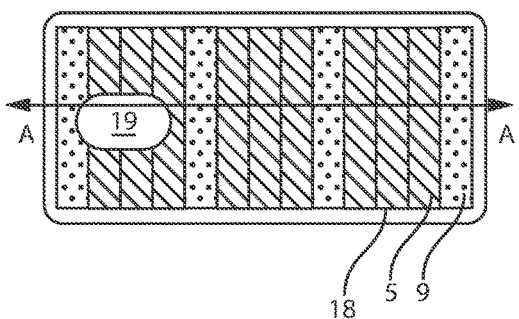

FIGS. 6A and 6B depict one embodiment of forming a second pillar 20. The second pillar 20 can be formed by etching a portion of the second hardmask dielectric layer 8 using at least the sidewall spacers 5 as an etch mask. More specifically, in one embodiment, a third etch mask 19 is formed over a portion of the second hardmask dielectric layer 8 on one side of the first via opening 15 between a recessed dielectric fill 17 that was formed between adjacent mandrels (now removed) and said recessed dielectric 17 in said first via opening 15. The third etch mask 19 having an opening to expose a portion the second hardmask dielectric layer 8 between said sidewall spacers 5 on a first side of the second pillar 20, as well as to expose a portion of the second hardmask dielectric layer 8 on the opposing second side of the second pillar 20. The third etch mask 19 may be composed of a photoresist material, and is similar to the first and second etch masks 13, 16 described above. Following formation of the third etch mask 19, the exposed portions of the second hardmask dielectric layer 8 may be etched to provide the second pillar 20 of hardmask material. The second pillar 20 may be adjacent an exposed portion of the first hardmask dielectric layer 9 that is present over the interlevel dielectric layers 11 positioned on opposing sides of the second pillar 20. The etch process for forming the second pillar 20 may be a selective etch process similar to the etch process described above for forming the first pillar 14. Following forming the second pillar 20, the third etch mask 19 may be removed.

Figure 7A:
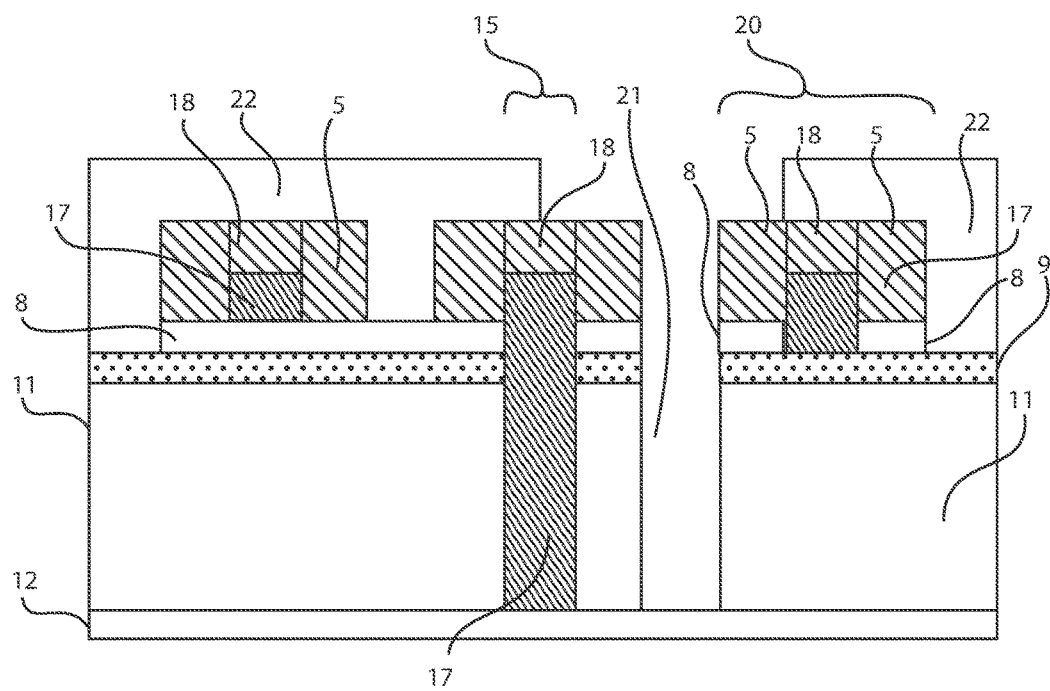
FIG. 7A is a side cross-sectional view depicting forming a second via opening, in accordance with one embodiment of the present disclosure.
Figure 7B:
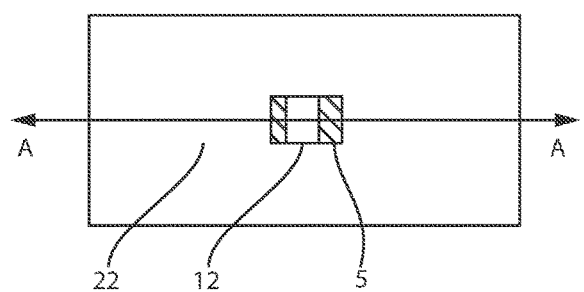

FIGS. 7A and 7B depict one embodiment of forming a second via opening 21. Forming the second via opening 21 may include etching the exposed portions of the first hardmask dielectric layer 9 and the interlevel dielectric layer 11 with the second pillar 20 of hardmask material. More specifically, forming the second via opening 21 may include etching the interlevel dielectric layer 11 with the second pillar 20 of hardmask material. Forming the second via opening 21 may further include forming a fourth etch mask 22 having an opening to the second pillar 20 and the exposed portion of the interlevel dielectric layer 11 adjacent (underlying the exposed portion of the first hardmask dielectric layer 9) to the spacer 5 abutting the first via opening 15. The fourth etch mask 22 may be a photoresist mask that can be similar to the first etch mask 13, second etch mask 16 and third etch mask 19. Therefore, the above description of the first etch mask 13 including its composition and method of forming is applicable for the description of the fourth etch mask 22.

The fourth etch mask 22 includes an opening exposing one of the at least two openings through the first hardmask dielectric layer 8 that are present on opposing sides of the sidewall spacers 5 corresponding to the second pillar 20. The second of the two openings, that is present on the opposing side of the second pillar 20 is covered, i.e., protected by the fourth etch mask 22. As depicted in FIG. 7A, the opening in the fourth etch mask 22 is greater in diameter than the diameter of second via opening 21. A portion of the sidewall spacers 5 and the divot filling cap 18 overlying the second pillar 20 is also exposed by the opening through the fourth etch mask 22. The fourth etch mask 22 only exposes one of the openings through the first hardmask dielectric layer 8 provided by the second pillar 20.

Still referring to FIG. 7A, the first hardmask dielectric layer 9 and the at least one interlevel dielectric layer 11 is etched to provide the second via opening 21 using the second pillar 20 of hardmask material and the fourth etch mask 22. More specifically, the at least one interlevel dielectric 11 may be etched by a selective etch process that removes the material of the first hardmask dielectric layer 9 and the interlevel dielectric layer 11 selectively to fourth etch mask 22, as well as the portion of the divot filling cap 18 and sidewall spacers 5 that are exposed by the opening through the fourth etch mask 22. The etch process may be an anisotropic etch, such as reactive ion etching (RIE). Following formation of the second via opening 21, the fourth etch mask 22 may be removed via etching, chemical washing, and/or oxygen ashing.

Figure 8:
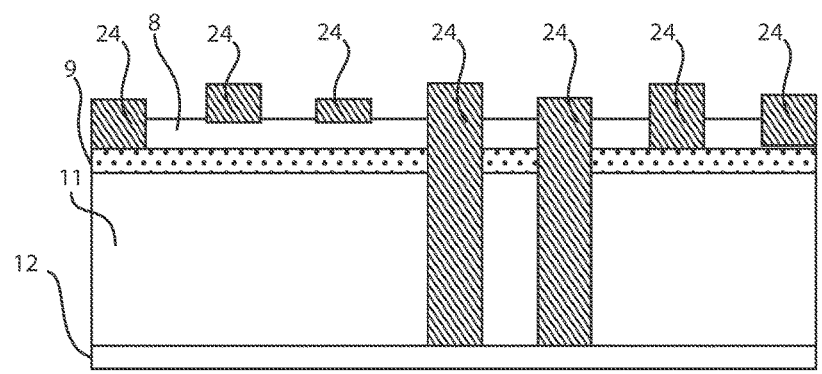
FIG. 8 is a side cross-sectional view depicting one embodiment of removing the etch mask for forming the second via opening that is depicted in FIG. 7, forming a second fill dielectric in the second via opening, removing the sidewall spacer and removing the divot cap.

FIG. 8 depicts one embodiment of removing the fourth etch mask 22, forming a second fill dielectric 24 in the second via opening 21, removing the sidewall spacer 5 and removing the divot cap 18. In one embodiment, the second via opening 21 may be filled with a second fill dielectric 24. The second fill dielectric 24 is similar to the first fill dielectric 17 that has been described above with reference to FIG. 5. Therefore, the description of the first fill dielectric 17 depicted in FIG. 5 is suitable for describing the second fill dielectric 24 depicted in FIG. 8. Further, similar to the first fill dielectric 17, the second fill dielectric 24 may be planarized to have an upper surface that is coplanar with the sidewall spacers 5. The second fill dielectric 24 may also have an upper surface that is coplanar with the upper surface of the divot fill cap 18. The second fill dielectric 24 may be etched selectively to the sidewall spacers 5 and the divot cap to recess the upper surface of the second fill dielectric 24. In some embodiments, following recessing of the second fill dielectric 24, an etch process may remove the sidewall spacer 5 and the divot fill cap 18. The first and second fill dielectrics 17, 24 may then be recessed with an etch process to remove the material from being present on the hardmask layers 8, 9.

Figure 9:
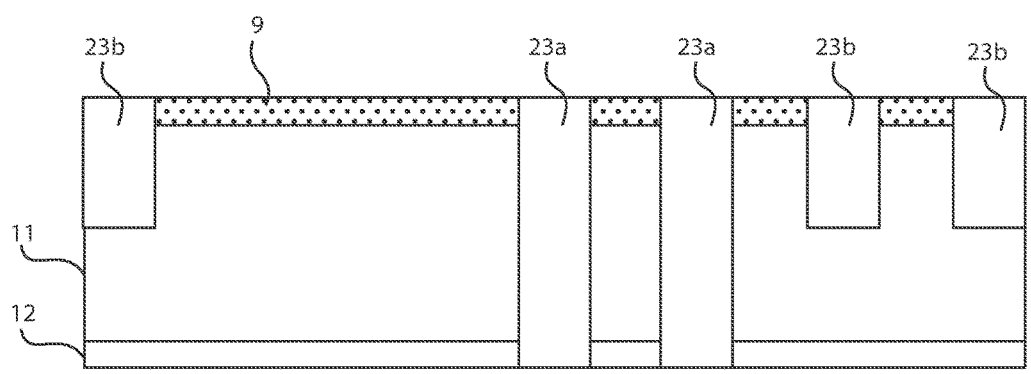
FIG. 9 is a side cross-sectional view depicting removing at least the second fill dielectric from the first and second via openings, and filling the first and second via openings with an electrically conductive material to provide a conductive via, in accordance with one embodiment of the present disclosure.

In a following step, the exposed hardmask layer 8,9 are used to pattern the interlevel dielectric to provide trenches, which can filled with a metal or electrically conductive semiconductor to provide electrically conductive lines 23b as illustrated in FIG. 9. The trenches may be formed with an etch process, such as reactive ion etch (RIE). Following formation of the trenches, at least a portion of the hardmask layers 8, 9 may be removed, and the first and second fill dielectrics 17, 24 may be removed from the first and second via openings 15, 21. An electrically conductive material may then be deposited in the first and second via openings 15, 21, as well as the trenches, which are formed in the at least one interlevel dielectric layer 11. The electrically conductive material that is deposited in the first and second via openings 15, 21 can provide electrically conductive vias 23a, which can carry electrical signal to devices that are underlying the at least one interlevel dielectric layer 11, as depicted in FIG. 9

The process sequence described above with reference to FIGS. 2-9 employ a mandrel structure to relax placement criteria by approximately 3×. In the embodiment described above, the mask count is equal to five. One mask is used for mandrel formation. Two masks, i.e., first and third masks 13, 19, are used for pillar formation. Two masks, i.e., second and fourth masks 16, 22, are used for via formation.

Figure 10:
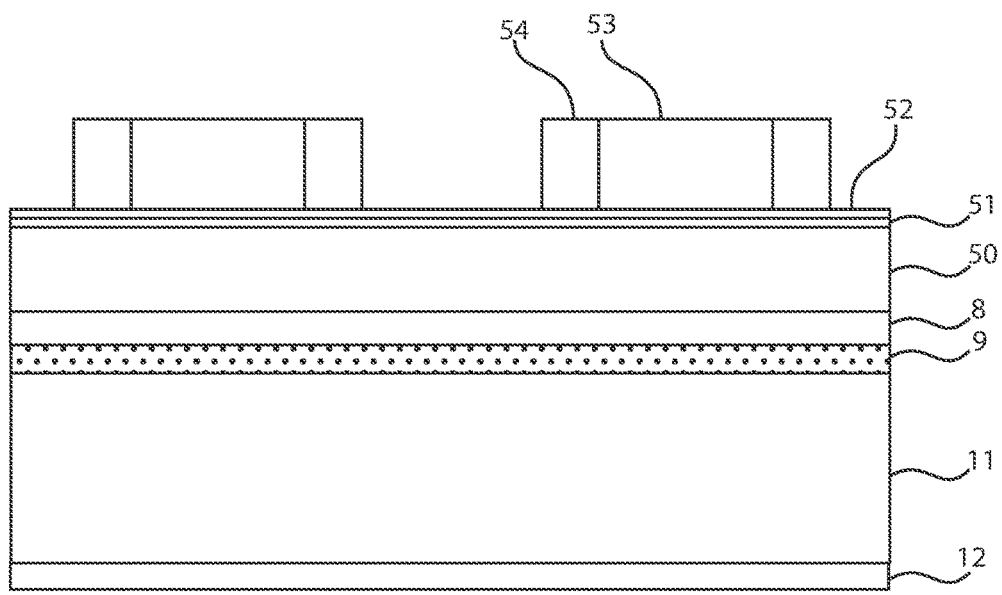
FIG. 10 is a side cross-sectional view depicting a first type of patterned mandrels overlying a material layer for a second type of mandrel that is present on at least one interlevel dielectric layer, and forming a first set of spacers on sidewalls of the first type of patterned mandrels for a self-aligned quadruple pitch (SAQP) method in accordance with another embodiment of the present disclosure.

Another embodiment of the present disclosure is now described with reference to FIGS. 10-15. In the embodiment depicted in FIGS. 10-15, a self-aligned quadruple pitch (SAQP) method for forming vias and pillar structures is provided. FIG. 10 depicts one embodiment of a first type of patterned mandrels 53 overlying a material layer 50 for a second type mandrel. A set of first sidewall spacers 54 may be present on the first type of patterned mandrels 53. In some embodiments, a low temperature oxide (LTO) layer 51 and a metal nitride layer 52 may be present between the first type of patterned mandrels 53 and the material layer 50 for the second type mandrel. In one embodiment, the low temperature oxide layer (LTO), e.g., silicon oxide ($SiO_2$), may be present on the material layer 50 for the second type mandrel. The metal nitride layer 52 may be present on the LTO layer 51. In one example, the metal nitride layer 52 may be composed of titanium nitride (TiN), but other metal nitrides may also provide the metal nitride layer 51, such as tantalum nitride and tungsten nitride. The structure depicted in FIG. 10 also includes at least one hardmask dielectric layer 8, 9 that is present on at least one layer of interlevel dielectric 11. The interlevel dielectric layers 11 can be present over a cap material layer 12. The hardmask dielectric layers 8, 9, the at least one interlevel dielectric 11, and the cap material layer 12 depicted in FIG. 10 have been described above with reference to FIG. 2.

The material layer 50 for the second type mandrel may be composed of any dielectric material, such as an oxide, nitride or oxynitride material The dielectric layer 50 may be formed on the upper surface of the metal nitride layer 51 using a deposition process, such as chemical vapor deposition (CVD), e.g., plasma enhanced chemical vapor deposition (PECVD). In one example, the material layer 50 for the second mandrel type is silicon nitride.

The first type of patterned mandrels 53 and the first sidewall spacers 54 that are depicted in FIG. 10 are similar to the plurality of mandrels 10 and the sidewall spacers 5 that are depicted in FIG. 2. Therefore, the description of the plurality of mandrels 10 and the sidewall spacers 5 depicted in FIG. 2 is suitable for describing at least one embodiment of the first type of patterned mandrels 53 and the first sidewall spacers 54 that are depicted in FIG. 10.

Figure 11:
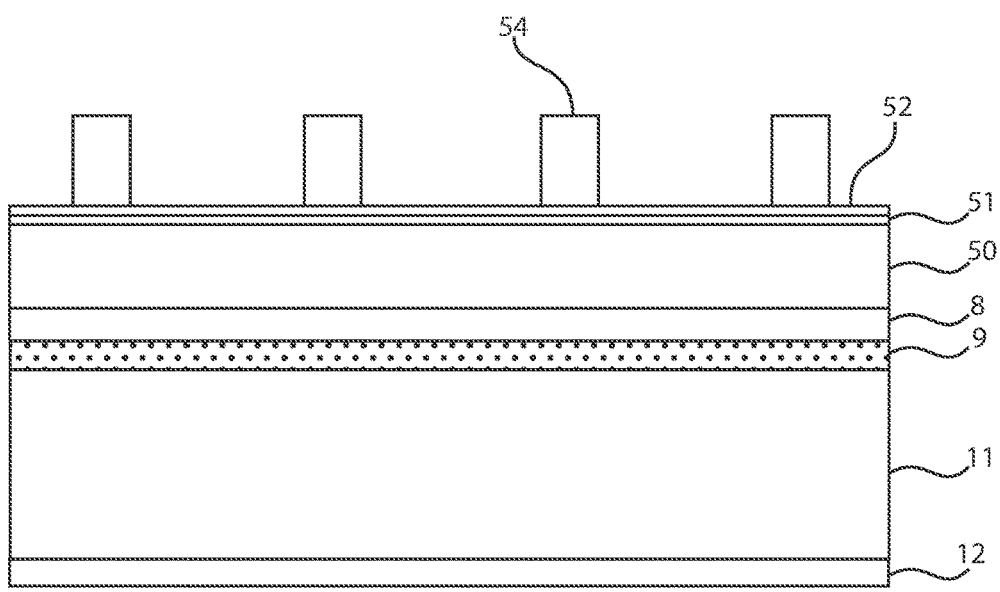
FIG. 11 is a side cross-sectional view depicting removing the first type mandrels.

FIG. 11 depicts one embodiment of removing the first type of mandrels 53. In some embodiments, the first type of mandrels 53 may be removed by an etch process that removes the material for the first type of mandrels 53 selectively to the first sidewall spacers and the metal nitride layer 53. Removing the first type of mandrels 53, as depicted in FIG. 11, is similar to removing the mandrels 10, as described with reference to FIG. 5. Therefore, further details for removing the first type of mandrels 53 have been described above with reference to FIG. 5.

Figure 12:
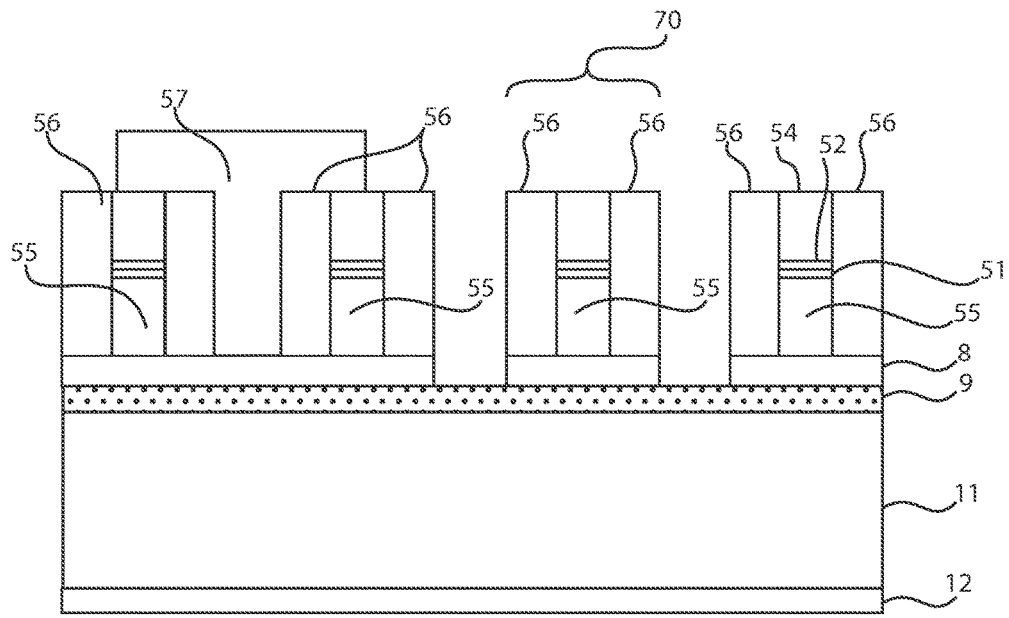
FIG. 12 is a side cross-sectional view depicting patterning the material layer for the second mandrel type using the first set of sidewall spacers as an etch mask, forming a second set of spacers on a second type of patterned mandrels, and performing a first pillar structure etch, in accordance with one embodiment of the present disclosure.

FIG. 12 depicts patterning the material layer 50 for the second mandrel type using the first set of sidewall spacers 54 as an etch mask, forming a second set of spacers 56 on a second type of patterned mandrels 55, and performing an etch to define a pillar structure 70. The material layer 50 for the second mandrel type may be etched using an anisotropic etch, such reactive ion etch (RIE), plasma etch, or laser ablation. The etch process may be a selective etch process. For example, when using the first sidewall spacers 54 as an etch mask, the etch process may remove the material of the exposed portions of the metal nitride layer 52, the LTO layer 51, and the material layer 50 for the second mandrel type selectively to the first sidewall spacers 54, as well as the at least one hardmask dielectric layer 8, 9. Following etching of the material layer 50 for the second material type, a plurality of second type of mandrels 55 are present overlying the hardmask dielectric layers 8, 9.

Still referring to FIG. 12, a second set of spacer 56 may be formed on the sidewalls of the second type of mandrels 56. The second set of spacers 56 are similar to the sidewall spacers 5 that have been described above with reference to FIG. 2. For example, the second set of spacers 56 may be composed of an oxide, such as silicon oxide ($SiO_2$). Further details regarding the composition, geometry and method of forming the second set of spacers 56 is provided above by the description of the sidewall spacers 5 depicted in FIG. 2.

FIG. 12 further depicts patterning a first pillar structure 70. More specifically, FIG. 12 depicts one embodiment of etching the hardmask layer 8, i.e., second hardmask layer, using a combination of a first photoresist mask 57 and a mask structure including the first set of sidewall spacers 54, the second type of mandrels 55 and the second set of spacers 56. Referring to FIG. 12, two portions of the second hardmask dielectric layer 8 are exposed, where the rest of the hardmask dielectric layer 8 is protected by at least the first photoresist mask 57 and a mask structure including the first set of sidewall spacers 54, the second type of mandrels 55 and the second set of spacers 56.

The exposed portions of the second hardmask layer 8 are etched to provide at least two openings through the second hardmask layer 8 with one opening on each of the opposing sides of the second set of sidewall spacers 56 that correspond to the sidewalls of the first pillar structure 70. The etch process for forming the first pillar structure 70 may be a selective etch process.

Figure 13:
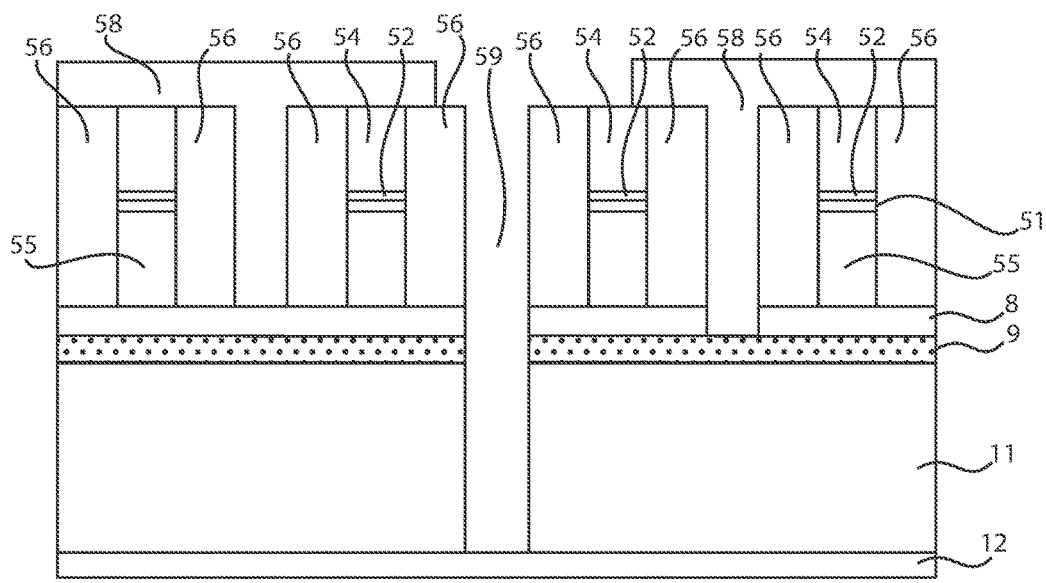
FIG. 13 is a side cross sectional view of forming a first via opening.

FIG. 13 depicts one embodiment of forming a first via opening 59 through the at least one interlevel dielectric layer 11. Forming the first via opening 59 may include etching the at least one interlevel dielectric layer 11 using the first pillar structure 70 of hardmask material. In some embodiments, forming the first via opening 59 may further include forming a second etch mask 58 over a portion of the sidewall spacers 56 and the plurality of second type of mandrels 55, as well as the first spacer 54. The second etch mask 58 may be a photoresist mask that can be similar to the first etch mask 57.

The second etch mask 58 includes an opening exposing one of the at least two openings through the first hardmask dielectric layer 8 that are on opposing sides of the pillar structure 70 in which the first via opening 59 is to be formed. The second of the two openings, that is present on the opposing side of the first pillar 70 is covered, i.e., protected by the second etch mask 58. As depicted in FIG. 13, the opening in the second etch mask 58 is greater in diameter than the diameter of the first via opening 59. A portion of the second set of sidewall spacers 56 and first set of spacers 54 overlying the first pillar 70 is also exposed by the opening through the second etch mask 58. The second etch mask 58 only exposed one of the openings through the first hardmask dielectric layer 8.

Still referring to FIG. 13, the at least one interlevel dielectric layer 11 is etched to provide the first via opening 59 using the first pillar structure and the second etch mask 58. The etch for forming the first via opening may also etch the first hardmask dielectric layer 9. More specifically, the at least one interlevel dielectric 11 may be etched by a selective etch process that removes the material of the first hardmask dielectric layer 9 and the interlevel dielectric layer 11 selectively to second etch mask 58, as well as the portion of first and second set of spacers 54, 56 that are exposed by the opening through the second etch mask 58. Following formation of the first via opening 59, the second etch mask 58 may be removed via etching, chemical washing, and/or oxygen ashing.

Figure 14:
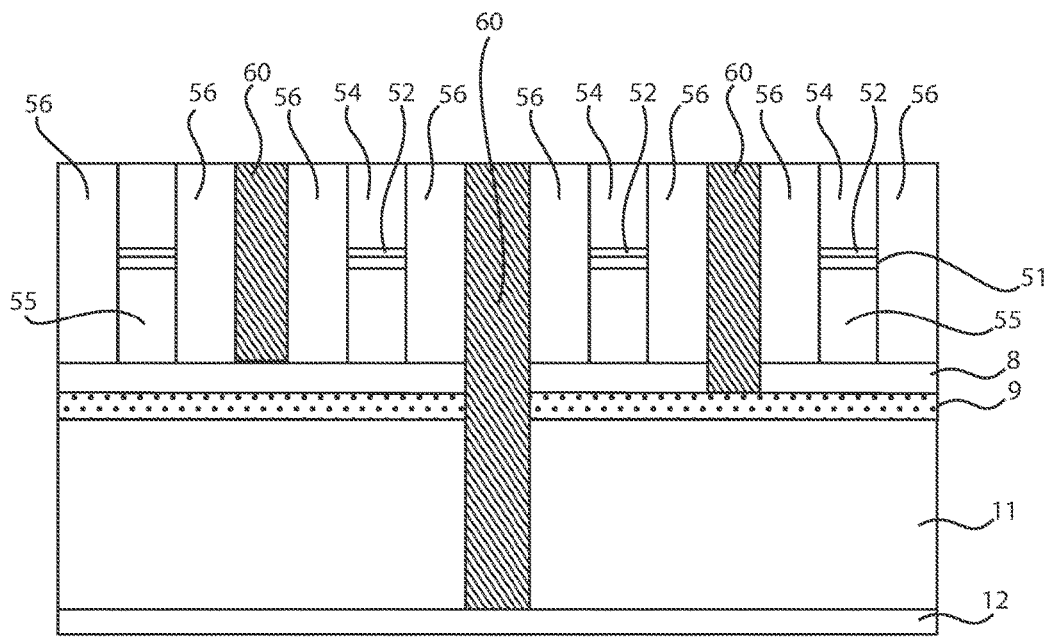
FIG. 14 is a side cross-sectional view depicting one embodiment of filling the first via opening with a fill dielectric, in accordance with one embodiment of the present disclosure.

FIG. 14 depicts one embodiment of filling the first via opening 59 with a fill dielectric 60. The fill dielectric 60 depicted in FIG. 14 is similar to the first fill dielectric 17 that has been described above with reference to FIG. 5. Therefore, the above description of the first fill dielectric 17 that is depicted in FIG. 5 is suitable to describe at least one embodiment of the fill dielectric 60 that is depicted in FIG. 14.

Figure 15:
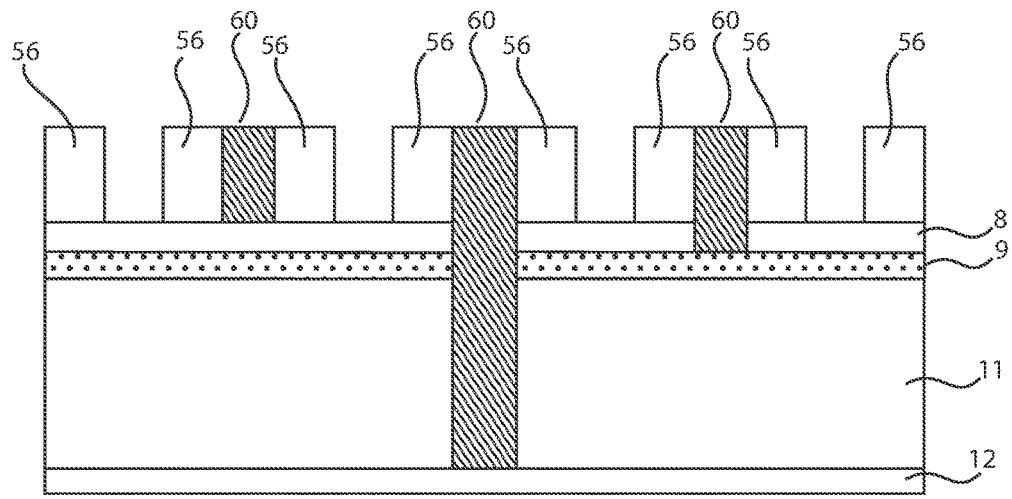
FIG. 15 is a side cross-sectional view depicting removing the second type mandrel to provide a structure for performing a second pillar structure etch, and forming a second via opening, in accordance with one embodiment of the present disclosure.

FIG. 15 depicts removing the first set of spacers 53, and recessing the second set of spacers 56, as well as the fill dielectric 60. These process steps may be provided by etching or planarization. FIG. 15 also depicts removing the second type mandrel 55 to provide a structure for performing a second pillar structure etch, and forming a second via opening. The second type mandrel 55 may be removed using selective etching. The structure depicted in FIG. 15 may be used with the process flow described with reference to FIGS. 5-9 to conduct a second pillar structure etch, as well as form a second via opening. For example, forming the second via opening may include forming a pillar etch mask having an opening exposing a portion of the hardmask layer 9 and the second set of spacers 56, and etching the portion of the hardmask layer 9 exposed by the pillar etch mask to form a second pillar of hardmask material. The second pillar may then be used to form the second via opening. For example, forming the second via opening may include forming a second via mask having an opening exposing a portion of the at least one interlevel dielectric layer 11 through an opening through the hardmask layer 9 that is adjacent to the second pillar of hardmask material, and etching the second via opening into the at least one interlevel dielectric. The first and second via opening may then be filled with electrically conductive material to provide electrically conductive vias.

The interconnect structures, i.e., vias and lines, that are described above with reference to FIGS. 1-15 may be employed in any electrical device. For example, the interconnect structures that are disclosed herein may be present within electrical devices that employ semiconductors that are present within integrated circuit chips. The integrated circuit chips including the disclosed interconnects may be integrated with other chips, discrete circuit elements, and/or other signal processing devices as part of either (a) an intermediate product, such as a motherboard, or (b) an end product. The end product can be any product that includes integrated circuit chips, including computer products or devices having a display, a keyboard or other input device, and a central processor.

Having described preferred embodiments of a system and method of SELF ALIGNED VIA AND PILLAR CUT FOR AT LEAST A SELF ALIGNED DOUBLE PITCH, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming via openings comprising:
   forming a first set of spacers on sidewalls of a first set of mandrels, the first set of mandrels present on a mandrel material layer for forming a second mandrel that is present overlying a hardmask layer and at least one interlevel dielectric layer;
   etching the mandrel material layer using the first set of spacers as an etch mask to form a second set of mandrels, wherein etching the mandrel material layer includes removing the first set of mandrels;
   forming a second set of spacers on sidewalls of the second set of mandrels;
   etching the hardmask layer using the second set of spacers and the second set of mandrels to define a first pillar of hardmask material;
   etching the interlevel dielectric layer using the first pillar of hardmask material and a first via etch mask to provide a first via opening;
   removing the second set of mandrels; and
   forming a second via opening in the interlevel dielectric layer.

2. The method of claim 1, wherein removing the second set of mandrels comprises:
   depositing a first fill dielectric in the first via opening;
   planarizing to remove the first set of spacers; and
   said removing said second set of mandrels with an etch process.

3. The method of claim 1, wherein said forming the second via opening comprises:
   forming a pillar etch mask having an opening exposing a portion of the hardmask layer and the second set of spacers;
   etching the portion of the hardmask layer exposed by the pillar etch mask to form a second pillar of hardmask material;
   forming a second via mask having an opening exposing a portion of the at least one interlevel dielectric layer through an opening through the hardmask layer that is adjacent to the second pillar of hardmask material; and
   etching the second via opening into the at least one interlevel dielectric.

4. The method of claim 1 further comprising filling the first via opening with an electrically conductive material.

5. The method of claim 1 further comprising filling the second via opening with an electrically conductive material.

6. The method of claim 1, wherein the interlevel dielectric layer comprises silicon oxide, silicon nitride, SiCOH, organosilicate glass (OSG), fluorine doped silicon dioxide, carbon doped silicon dioxide, porous silicon dioxide, porous carbon doped silicon dioxide, spin-on organic polymeric dielectrics, spin-on silicone based polymeric dielectric, undoped silica glass, diamond like carbon (DLC), methylsilsesquioxane (MSQ) or combinations thereof.

7. The method of claim 1, wherein said etching the interlevel dielectric layer using the first pillar of the hardmask material and the first via etch mask to provide the first via opening comprises anisotropic etch process.

8. The method of claim 1, wherein the second set of mandrels comprises an oxide, nitride, oxynitride or combination thereof.

* * * * *